US012595168B2

(12) United States Patent
Severi et al.

(10) Patent No.: US 12,595,168 B2
(45) Date of Patent: Apr. 7, 2026

(54) METHOD FOR MANUFACTURING A MICROFLUIDIC DEVICE

(71) Applicant: IMEC VZW, Leuven (BE)

(72) Inventors: Simone Severi, Leuven (BE); Bert Du Bois, Blanden (BE); Ashesh Ray Chaudhuri, Heverlee (BE)

(73) Assignee: IMEC VZW, Leuven (BE)

( * ) Notice: Subject to any disclaimer, the term of this patent is extended or adjusted under 35 U.S.C. 154(b) by 728 days.

(21) Appl. No.: 18/045,287

(22) Filed: Oct. 10, 2022

(65) Prior Publication Data

US 2023/0127645 A1 Apr. 27, 2023

(30) Foreign Application Priority Data

Oct. 26, 2021 (EP) ..................................... 21204705

(51) Int. Cl.
*B81C 1/00* (2006.01)
*B81B 1/00* (2006.01)

(52) U.S. Cl.
CPC .......... *B81C 1/00047* (2013.01); *B81B 1/004* (2013.01); *B81C 1/00087* (2013.01); *B81B 2201/06* (2013.01); *B81C 2201/0133* (2013.01)

(58) Field of Classification Search
CPC ............ B81C 1/00047; B81C 1/00087; B81C 2201/0133; B81B 1/004; B81B 2201/06;
(Continued)

(56) References Cited

U.S. PATENT DOCUMENTS

2007/0020146 A1* 1/2007 Young ................. B81C 1/00087
422/82.01
2010/0081278 A1* 4/2010 Hussain ................. B82Y 10/00
257/E21.585
(Continued)

FOREIGN PATENT DOCUMENTS

WO 2011/130312 A1 10/2011
WO 2017/108591 A1 6/2017

OTHER PUBLICATIONS

Extended European Search Report for European Patent Application No. 21204705.4 mailed Mar. 31, 2022.
(Continued)

*Primary Examiner* — Brian J. Sines
(74) *Attorney, Agent, or Firm* — McDonnell Boehnen Hulbert & Berghoff LLP

(57) ABSTRACT

An intermediate structure for a microfluidic device and a method for manufacturing a microfluidic device are provided. The method includes: a) providing a first substrate having a first layer thereon, and a second layer on the first layer; b) forming a first nanopore in the second layer, in such a way that a part of the first layer coincides with a bottom of the first nanopore; c) exposing said part of the first layer to a liquid etchant, thereby forming a cavity under the first nanopore, the cavity having a larger width than a width of the bottom of the first nanopore; d) filling the first nanopore and the cavity with a filling material, thereby forming a first plug; e) forming a bottom fluidic access for the nanopore by removing part of the first substrate and part of the first layer so as to expose the plug; and f) removing the plug, thereby fluidly connecting the bottom fluidic access to the nanopore.

12 Claims, 9 Drawing Sheets

(58) Field of Classification Search
CPC ....... B01L 3/502761; B01L 2300/0887; B01L
2300/0896; B01L 3/502707
See application file for complete search history.

(56)                    References Cited

U.S. PATENT DOCUMENTS

| | | |
|---|---|---|
| 2015/0056407 A1 | 2/2015 | Astier et al. |
| 2015/0056732 A1* | 2/2015 | Astier .................... B32B 3/266 |
| | | 438/49 |
| 2021/0300752 A1* | 9/2021 | Fiorentino ........ B01L 3/502707 |

OTHER PUBLICATIONS

Fraikin et al., "A High-Throughput Label-Free Nanoparticle Analyser," Nature Nanotechnology, 2011, vol. 6, pp. 308-313.

* cited by examiner

(a)

(b)

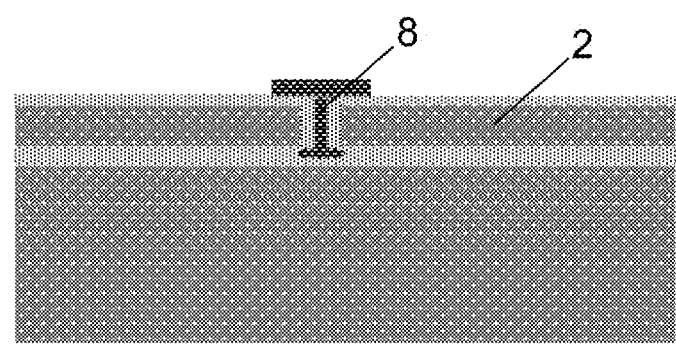
FIG. 14
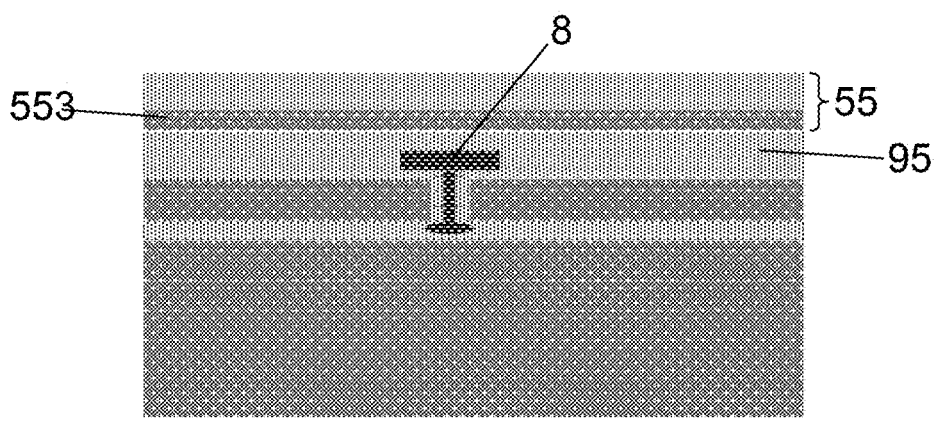
FIG. 15
FIG. 16

METHOD FOR MANUFACTURING A MICROFLUIDIC DEVICE

CROSS-REFERENCE

This application claims priority from European Patent application No. 21204705.4, filed on Oct. 26, 2021, which is incorporated by reference in its entirety.

TECHNICAL FIELD OF THE DISCLOSURE

The present disclosure relates to the field of manufacturing of microfluidic devices, and in particular to manufacturing of microfluidic devices comprising a nanopore.

BACKGROUND OF THE DISCLOSURE

The handling of biomolecules in microfluidic devices often requires the presence of a nanopore through which one biomolecule can pass at a time. For instance, if a transistor or an electrode is present and configured in such a way as to sense the passage of the biomolecules, the biomolecules can be counted and/or their nucleic or amino acid sequence can be determined. For instance, sensing can operate by detecting a change in ionic current or electrostatic potential. In the broad landscape of genomics, there are several fields that can benefit from such microfluidic devices, including but not limited to DNA sequencing, DNA synthesis, epigenetics, and diagnostics (e.g., virus detection).

One option is to provide a nanopore in a microfluidic device by etching it in a solid layer. Once formed, the nanopore typically still needs to be connected to a top and a bottom fluidic access.

This may cause problems related to the integrity of the nanopore. During the formation of the fluidic accesses to the nanopore, it can be very hard to preserve the shape and the dimension of the nanopore. Wet or dry etching processes are typically utilized to open the fluidic accesses. The selectivity of these processes to the solid layer where the nanopore is formed is usually limited. No matter how much process development and etch selectivity is achieved, there is a risk that the pore can enlarge by a few nanometers or change its surface composition and its wetting properties.

Furthermore, the presence of an electrode or a transistor in contact with the liquid environment and in close proximity with the nanopore is often required. Forming these components when the nanopore is already formed can present a significant risk of damaging the nanopore.

It is usually not possible to form the nanopore after these components are formed without compromising the quality and dimensions of the nanopore.

There is therefore a need in the art for new methods and systems made thereby overcoming at least partially one or more of these issues.

SUMMARY OF THE DISCLOSURE

It is an object of the present disclosure to provide new methods for connecting a nanopore to a fluidic access in a microfluidic device.

The above objective is accomplished by methods according to the present claims.

In a first aspect, the present disclosure relates to a method for manufacturing, i.e., forming a microfluidic device, the method comprising:
a. Providing a first substrate having a first layer thereon, and a second layer on the first layer, wherein the second layer has a bottom surface in (physical) contact with a top surface of the first layer, and a top surface facing away from the first layer,
b. Forming a first nanopore in the second layer in such a way that a part of the first layer coincides with a bottom of the first nanopore, wherein forming the first nanopore comprises a dry etching step,
c. Exposing said part of the first layer to a liquid etchant, thereby forming a cavity under the first nanopore, the cavity having a larger width than a width of the bottom of the first nanopore after step c and before step d,
d. Filling the first nanopore and the entire cavity with a solid filling material, thereby forming a first plug,
e. Forming a bottom fluidic access for the nanopore by removing part of the first substrate and part of the first layer so as to expose (part of) the plug,
f. Removing the first plug, thereby fluidly connecting the bottom fluidic access to the first nanopore.

In embodiments, the width (w1') of the first nanopore after step f may be within 1 nm of the width (w1) of the first nanopore between step c and step d, when measured in the plane of the bottom surface of the second layer.

In embodiments, the first layer may be a silicon oxide layer and the liquid etchant used in step c may comprise HF.

In embodiments, the first substrate may comprise an Si layer.

In embodiments, the first nanopore may have a width (w0) after step b and before step c ranging 3 to 50 nm, ranging from 5 to 45 nm, or ranging from 8 to 30 nm, when measured in the plane of the bottom surface of the second layer.

In embodiments, the first nanopore may have a length through the second layer after step b and before step c ranging from 400 nm to 2 μm.

In embodiments, step b may comprise a step b1 of dry etching a precursor nanopore in the second layer, said precursor nanopore having a width (w0), followed by a step b2 between step b1 and step c of narrowing the width (w0) of the precursor nanopore by oxidizing inner walls thereof.

In embodiments, the width (w0) of the first nanopore before step b2 may range from 100 to 300 nm, and the width (w0') of the first nanopore after step b2 and before step c may range from 8 to 30 nm.

In embodiments, the method may further comprise a step d' between step d and step e of:
i. Covering the first plug with an oxide layer,
ii. Planarizing the oxide layer,
iii. Bonding a second substrate on the planarized oxide layer, the second substrate comprising a semiconductor layer,
iv. dry etching a second nanopore, aligned with the first nanopore, in the second substrate and the oxide layer, until a part of the first plug coincides with a bottom of the second nanopore, the second nanopore having a width (w2) measured in the plane of the top surface of the semiconductor layer, ranging from 5 to 15 times the width (w1') of the first nanopore after step f,
v. filling the second nanopore with a solid filling material, thereby forming a second plug,
vi. doping the semiconductor layer on opposite (lateral) sides of the second nanopore, thereby forming a source region and a drain region,
vii. activating the source region and the drain region by annealing, and
viii. forming metal contacts to the source and the drain region.

In embodiments, the method may further comprise a step e', between step d and step f, of either:

if the second nanopore and the second plug are not present, forming a top fluidic access for the first nanopore by providing a third layer over the second layer and the first plug if such a third layer is not already present, and removing part of the third layer so as to expose the first plug, or if the second nanopore and the second plug are present, forming a top fluidic access for the second nanopore by providing a third layer over the second substrate and the second plug if such a third layer is not already present, and removing part of the third layer so as to expose the second plug.

In embodiments, step d' may be performed before step e'.

In embodiments, the method may further comprise a step of removing the second plug, thereby fluidly connecting the top fluidic access to the second nanopore.

In embodiments, step e' may be performed before step e.

In embodiments, the bottom fluidic access, and if present, the top fluidic access, may each comprise a channel having a width of less than 100 μm.

In embodiments, step c may be performed until a part of the bottom surface of the second layer, around a periphery of the bottom of the first nanopore, is exposed to the liquid etchant.

In a second aspect, the present disclosure relates to an intermediate in the construction of a microfluidic device comprising:

a. A first substrate, b. A first layer on the first substrate, the first layer having a top surface, c. A second layer on the first layer, wherein the second layer has a bottom surface in contact with the first layer and a top surface facing away from the first layer, d. A first nanopore through the second layer, having a bottom in the plane of the top surface of the first layer, and e. A cavity under the first nanopore, fluidly connected therewith, and having a larger width (W) than a width (w1) of the nanopore.

In embodiments, the cavity may expose a part of the bottom surface of the second layer around a periphery of the bottom of the nanopore.

It is a benefit of embodiments of the present disclosure that it protects the nanopore from contaminants, thereby preventing its clogging.

It is a benefit of embodiments of the present disclosure that it protects the nanopore from damages, thereby ensuring the conservation of its dimensions and surface properties.

It is a benefit of embodiments of the present disclosure that it is compatible with standard microfluidic processing steps and with cleanroom protocols.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, and benefits of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 1 shows an exemplary embodiment of a configuration where further layers are present. In step a, a first substrate (5) is provided, having a first layer (1) thereon, and a second layer (2) on the first layer (1), wherein the second layer (2) has a bottom surface (21) in physical contact with a top surface (12) of the first layer (1), and a top surface (22) facing away from the first layer (1).

FIG. 2, part a, shows representative structures resulting from step b. FIG. 2, part b, is an enlargement of FIG. 2, part a.

FIG. 3 shows the result of step c is depicted for a representative embodiment of the present disclosure. In step c, said part (10) of the first layer (1) is exposed to a liquid etchant, thereby forming a cavity (7) under the first nanopore (6), the cavity (7) having a larger width (W) than a width (w1) of the bottom (61) of the first nanopore (6) after step c and before step d.

FIG. 4 shows representative structures resulting from step d. In step d, the first nanopore (6) and the entire cavity (7) is filled with a solid filling material, thereby forming a first plug (8). The presence of the first plug (8) will protect the first nanopore (6) during step e, and in some embodiments, during step e'. Typically, the solid filling material is provided in the first nanopore (6) and in the entire cavity (7) by a conformal deposition process, such as chemical vapor deposition, e.g., high aspect ratio chemical vapor deposition.

FIGS. 5 and 6 shows representative intermediates obtained during step e. In step e, a bottom fluidic access (91) for the nanopore is formed by removing part of the first substrate (5) (see FIG. 5) and part of the first layer (1) (see FIG. 6) so as to expose the plug (8).

FIGS. 7 to 9 show where a top fluidic access (92) is formed in the third and fourth layer before that the bottom fluidic access (91) is formed.

FIG. 10 shows a representative structure after that step f has been performed in the embodiment of FIG. 9. As shown in FIG. 10, the removal of the first plug (8) results in the fluidic connection of both the bottom fluidic access (91) and the top fluidic access with the first nanopore (6).

FIGS. 11 to 19 show cross-sections through schematic representations of intermediate structures obtained after various steps of yet another embodiment of the present disclosure.

FIG. 11 shows that a representative precursor nanopore can be formed in the second layer in such a way that part of the first layer (1) coincides with a bottom of the precursor nanopore. The precursor nanopore can be formed via a dry etching step b1. The precursor nanopore has a width (w0).

FIG. 12 shows a representative structure resulting from a step b2, performed between step b1 and step c, of narrowing the width (w0) of the precursor nanopore (6) by oxidizing inner walls (63) thereof.

FIG. 13 shows a representative structure resulting from step c.

FIG. 14 shows a representative structure resulting from step d where the first plug (8) covers part of the top surface of an oxide layer present on the second layer (2).

FIG. 15 shows a representative second substrate including a semiconductor layer (553) and an oxide layer thereover resulting from the bonding of a silicon-on-insulator substrate on the planarized oxide layer resulting from step d'.ii., followed by the removal of the top silicon layer of the silicon-on-insulator substrate FIG. 16 shows the result of step d'.iv. of a representative embodiment of the method where step d'.iv. comprises dry etching a second nanopore (65), aligned with the first nanopore (6), in the second substrate (55) and the oxide layer (95), until a part (80) of the first plug (8) coincides with a bottom (651) of the second nanopore (65), the second nanopore (65) having a width (w2) measured in the plane of the top surface (5532) of the semiconductor layer (553), ranging from 5 to 15 times the width (w1') of the first nanopore (6) after step f.

FIG. 17 shows a representative structure resulting from steps d'.v to d'.viii in an exemplary embodiment of the present disclosure.

FIG. 18 shows a representative structure resulting from step e.

FIG. 19 shows representative example of microfluidic device that can be formed by the present disclosure. For example, the illustrated nanopore transistor may be for sensing the presence of polynucleic acids such as deoxyribonucleic acid (DNA) or ribonucleic acid (RNA).

Figure 1:
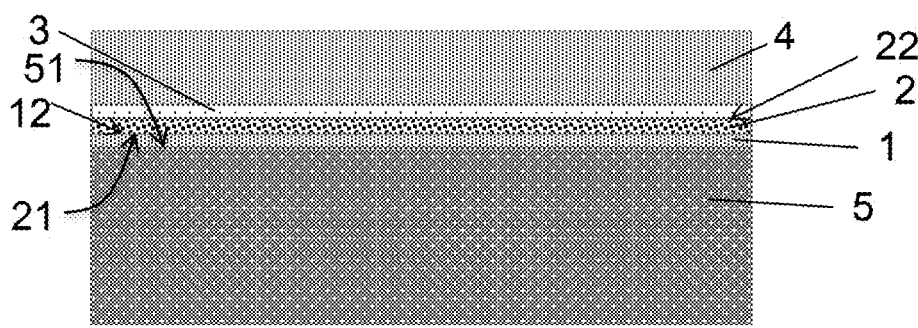
FIGS. 1 to 6 show cross-sections through schematic representations of intermediate structures obtained after various steps of an embodiment of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third, and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "on" implies direct physical contact while the term "over" implies that direct physical contact may or may not exist.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, or components, or groups thereof. The term "comprising" therefore covers the situation where only the stated features are present (and can therefore always be replaced by "consisting of" in order to restrict the scope to said stated features) and the situation where these features and one or more other features are present. The word "comprising" according to the disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure, and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

In a first aspect, the present disclosure relates to a method for manufacturing, i.e., forming, a microfluidic device, the method comprising:

a. Providing a first substrate having a first layer thereon, and a second layer on the first layer, wherein the second layer has a bottom surface in contact with a top surface of the first layer, and a top surface facing away from the first layer, b. Forming a first nanopore in the second layer in such a way that a part of the first layer coincides with a bottom of the first nanopore, wherein forming the first nanopore (6) comprises a dry etching step, c. Exposing said part of the first layer to a liquid etchant, thereby forming a cavity under the first nanopore, the cavity having a larger width than a width of the bottom of the first nanopore after step c and before step d, d. Filling the first nanopore and the entire cavity with a solid filling material, thereby forming a first plug, e. Forming a bottom fluidic access for the nanopore by removing part of the first substrate and part of the first layer so as to expose the plug, f. Removing the first plug, thereby fluidly connecting the bottom fluidic access to the first nanopore.

Figure 20:
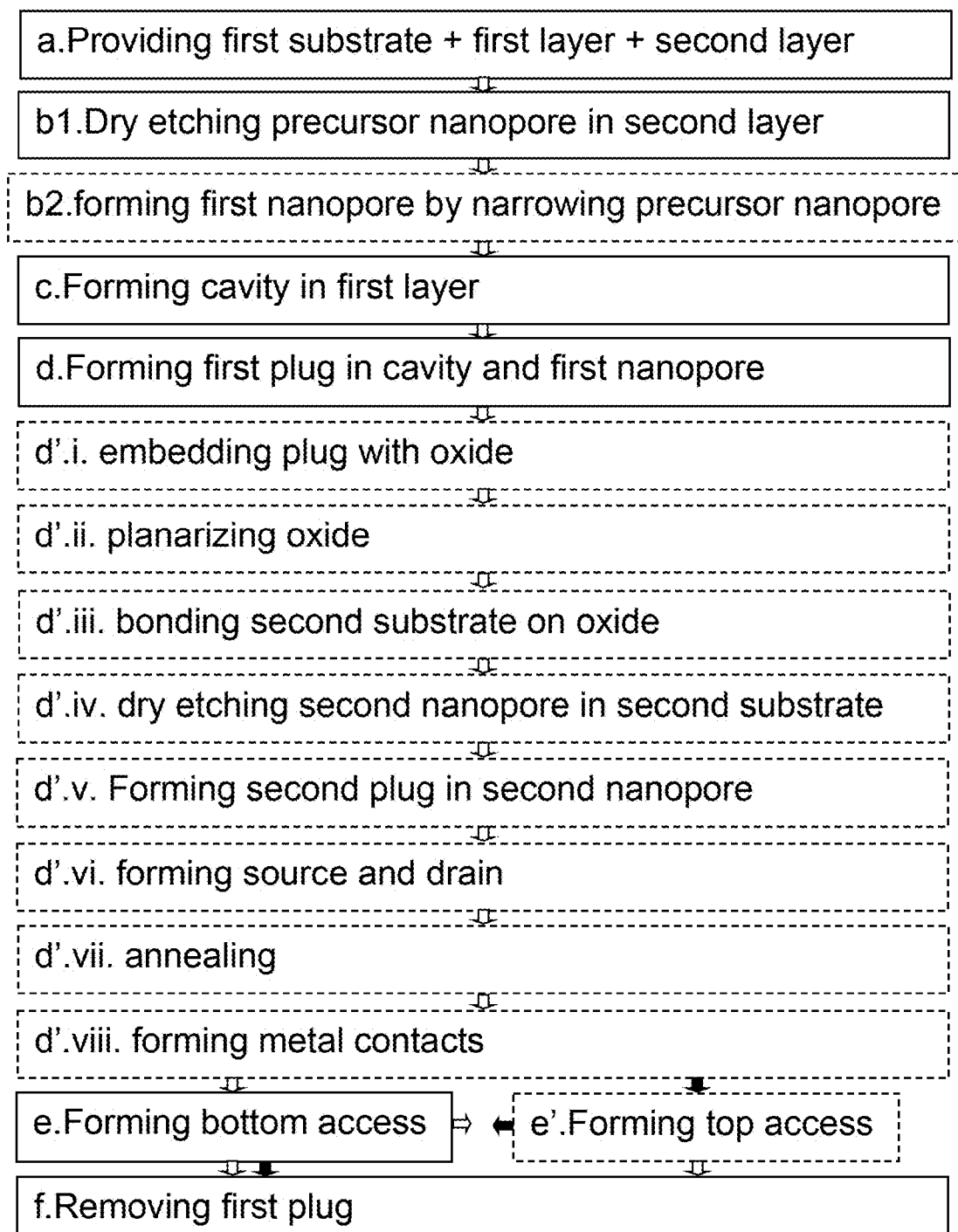
FIG. 20 is a flowchart summarizing some embodiments of the first aspect of the present disclosure.

These steps are summarized in the flowchart of FIG. 20 where they are framed with a continuous line. Optional steps are represented in FIG. 20 as being framed by a dashed line. The black arrows in FIG. 20 show a sequence of steps alternative to the sequence of steps depicted by white arrows.

Figure 19:
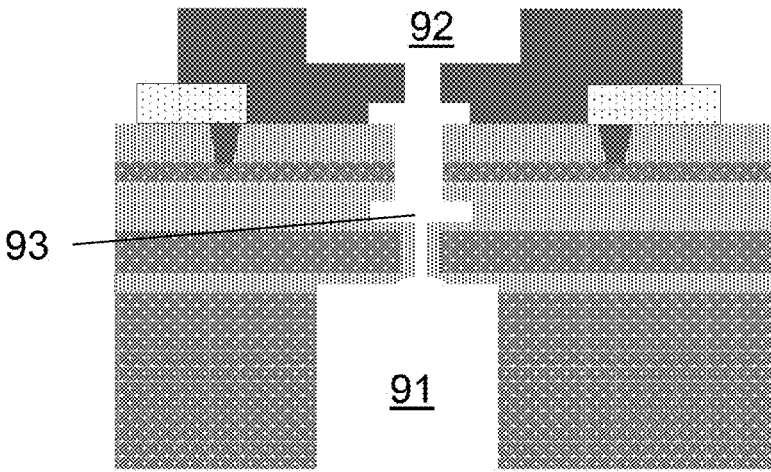

A typical example of microfluidic device that can be formed by the present disclosure is a nanopore transistor for biosensing. An example thereof is shown in FIG. 19. For example, the nanopore transistor may be for sensing the presence of polynucleic acids such as deoxyribonucleic acid (DNA) or ribonucleic acid (RNA).

Another typical example of microfluidic device that can be formed by the present disclosure is a fluidic resistor. The method of the present disclosure is particularly well suited for forming a nanopore transistor for biosensing comprising a fluidic resistor. An example thereof is shown in FIG. 19.

We refer to FIGS. 1 to 6 schematically showing vertical cross-sections of intermediate structures obtained during a method according to an embodiment of the present disclosure.

We now refer to FIG. 1. In step a., a first substrate (5) is provided, having a first layer (1) thereon, and a second layer (2) on the first layer (1), wherein the second layer (2) has a bottom surface (21) in physical contact with a top surface (12) of the first layer (1), and a top surface (22) facing away from the first layer (1).

In embodiments, the first substrate (5) comprises a semiconductor layer. Generally, the semiconductor layer is an Si layer (5). Typically, the semiconductor layer is a monocrystalline Si layer (5).

In embodiments, the semiconductor layer comprises the top surface (51) of the first substrate (5). For instance, the first substrate may be a silicon-on-insulator substrate (5) or a silicon wafer (5). Generally, the semiconductor layer (5) is the first substrate (5). For instance, the first substrate (5) may be a silicon wafer (5).

In embodiments, the first substrate (5) may have a thickness ranging from 200 μm to 1.5 mm, generally ranging from 300 μm to 800 μm, or typically ranging from 400 μm to 500 μm.

Generally, the chemical nature of the first layer (1) is different from the chemical nature of the second layer (2). This way, the second layer (2) can be dry etched selectively with respect to the first layer. This can make it easier to stop step b as soon as the first layer (1) is reached. The first layer is generally an oxide layer and is typically a silicon oxide such as $SiO_2$.

In embodiments, the thickness of the first layer ranges from 1 nm to 100 nm, typically ranging from 10 nm to 20 nm.

The first layer (1) is on the first substrate (5), i.e., it is in direct physical contact with the first substrate (5).

The second layer (2) is a layer that can be dry etched selectively with respect to the first layer. For instance, it can be a SiN layer or it can be a semiconductor layer such as a monocrystalline semiconductor (e.g., silicon) layer. If the second layer is a monocrystalline semiconductor layer, the assembly of the substrate, the first layer, and the second layer, can be a semiconductor-on-insulator substrate (e.g. a Silicon-on-insulator substrate).

The structure provided in step a may comprise further layers. FIG. 1 shows a configuration where further layers are present. In particular, in the exemplary embodiment of FIG. 1, a third layer (3) (e.g. $Al_2O_3$) is present on the second layer (2) and a fourth layer (4) ($SiO_2$) is present on the third layer (3). In this example, the fourth layer (4) may act as a hard mask layer. In this example, the third layer (3) may act as an etch stop layer, when using an etchant that selectively etches the fourth layer and not the third layer. Thereby, a pattern, comprising an opening, may be etched in the fourth layer (4) without etching the third layer (3), which acts as the etch stop layer.

In embodiments, the thickness of the second layer (2) may range from 10 nm to 1000 nm, generally ranging from 30 nm to 50 nm.

Figure 2:
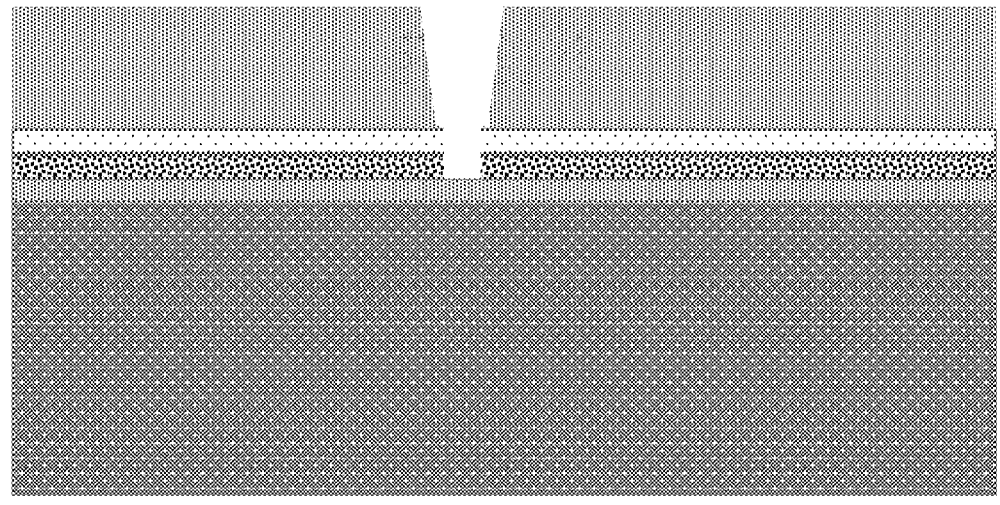
Figure 2:
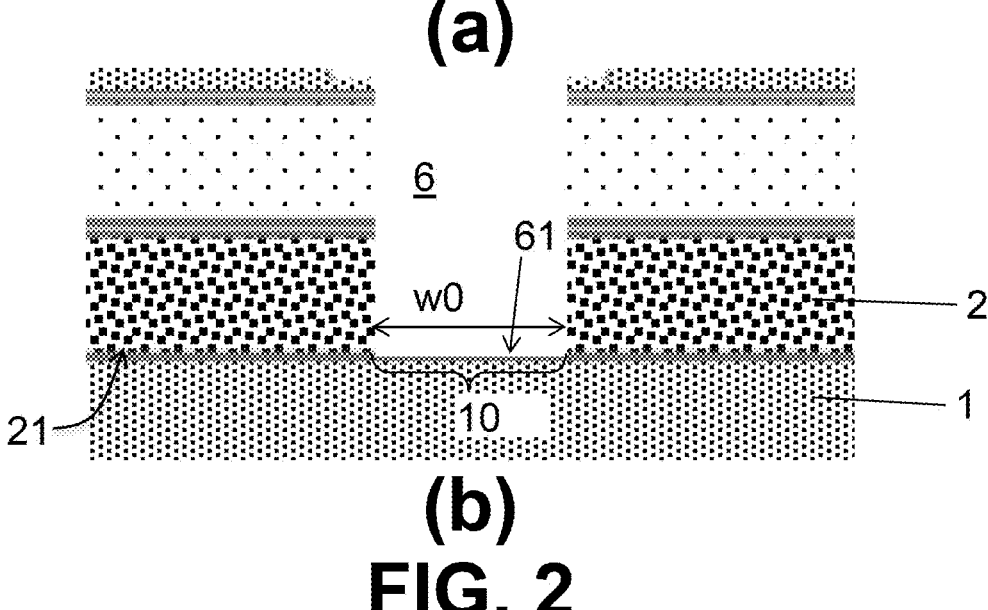

We now refer to FIG. 2, parts a and b, and 12 wherein structures resulting from step b performed in embodiments of the present disclosure are depicted. FIG. 2, part (b), shows an enlarged section of FIG. 2, part (a).

In step b, a first nanopore (6) is formed in the second layer (2) in such a way that a part (10) of the first layer (1) coincides with a bottom (61) of the first nanopore (6), wherein forming the first nanopore (6) comprises a dry etching step. In this example, the first nanopore (6) is formed by transferring, with the dry etching step, the pattern etched in the fourth layer (4), i.e., the opening, into the third layer (3), and the second layer (2). Typically, the dry etching selectively etches the second layer (2) and the third layer (3), but not the fourth layer (4).

Generally, the dry etching stops as soon as the first layer (1) is exposed.

The dry etching chemistry is selected in such a way that the second layer (2) can be dry etched selectively with respect to the first layer (1). For instance (see FIG. 2), if the second layer (2) is SiN and the first layer (1) is $SiO_2$, the dry etch may be performed with a dry etch comprising a $CF_4$ plasma. As another example (see FIG. 10), if the second layer (2) is Si and the first layer (1) is $SiO_2$, the dry etch may be performed with a dry etch comprising a $CF_4$ plasma.

The dry etching is typically anisotropic and etches the second layer (2) faster in a direction perpendicular to the top surface (22) of the second layer (2) than in a direction parallel to the top surface (22) of the second layer (2).

In embodiments, the first nanopore (6) may have a width that is constant across the second layer (2).

In embodiments, the horizontal cross-section of the nanopore may be the same across the second layer (2).

In embodiments, this cross section may be circular.

In embodiments, the first nanopore (6) may have a width (w0) after step b and before step c ranging from 3 to 50 nm, generally ranging from 5 to 45 nm, or typically ranging from 8 to 30 nm, when measured in the plane of the bottom surface (21) of the second layer (2).

In embodiments, the first nanopore (6) may have a length through the second layer (2) after steep b and before step c ranging from 400 nm to 2 μm.

Figure 12:
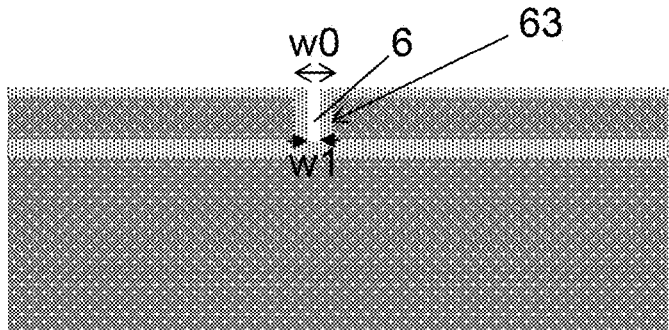

In embodiments, step b may comprise a step b1 of dry etching a precursor nanopore in the second layer, said precursor nanopore having a width (w0), followed by a step b2 between step b1 and step c of narrowing the width (w0) of the first nanopore (6) by oxidizing inner walls (63) thereof. This is depicted in FIG. 12. Step b2 allows obtaining a first nanopore having a width which is typically not achievable by standard lithography. In this embodiment involving the narrowing of the width of a precursor nanopore, the width of the precursor nanopore before the narrowing may range from 100 to 300 nm.

In an embodiment, the width (w0) of the first nanopore (6) before step b2 may range from 100 to 300 nm, and the width (w0') of the first nanopore (6) after step b2 and before step c may range from 3 to 50 nm, generally ranging from 5 to 45 nm, or typically ranging from 8 to 30 nm.

Figures 3, 4:
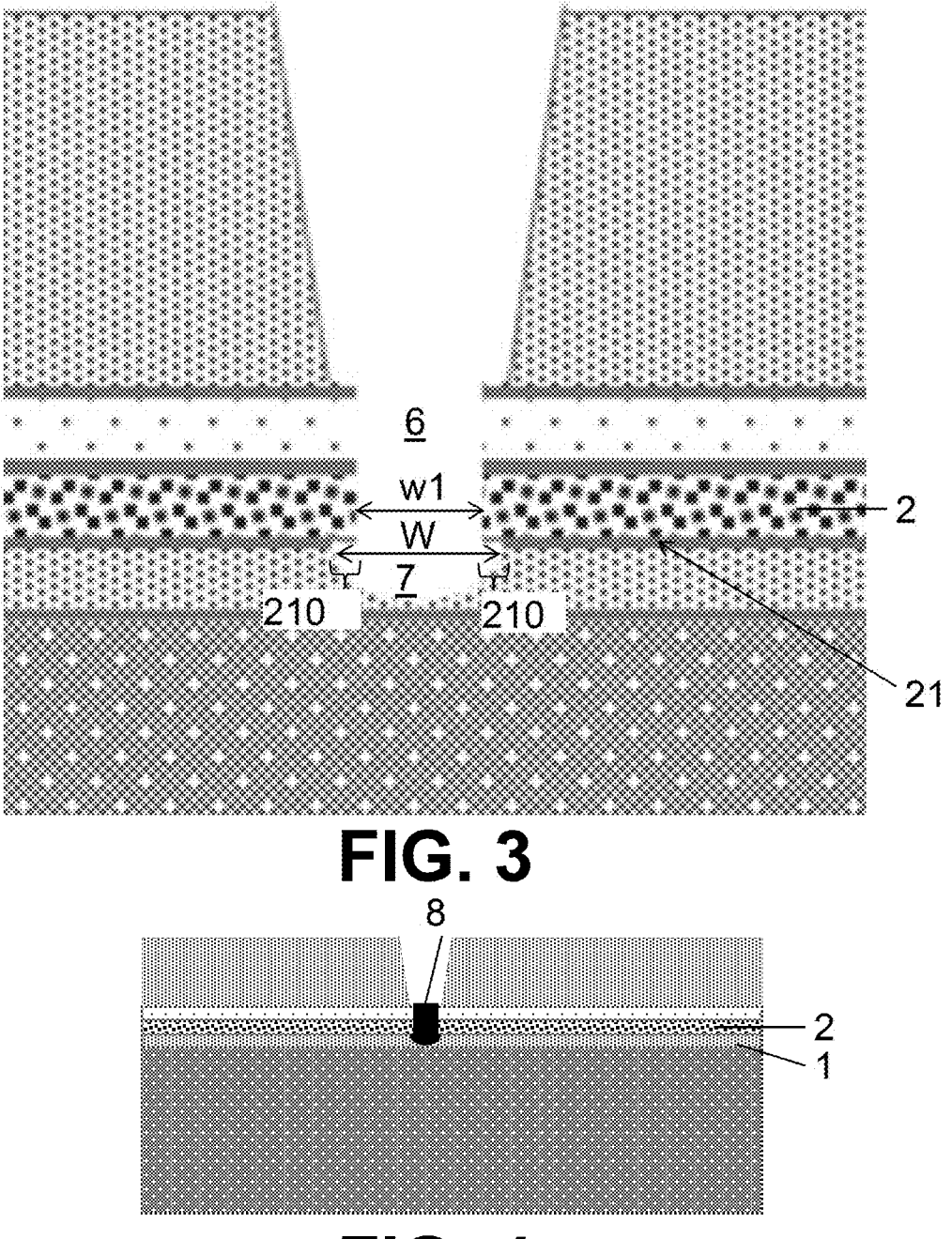

We now refer to FIG. 3 where the result of step c is depicted for an embodiment of the present disclosure. In step c, said part (10) of the first layer (1) is exposed to a liquid etchant, thereby forming a cavity (7) under the first nanopore (6), the cavity (7) having a larger width (W) than a width (w1) of the bottom (61) of the first nanopore (6) after step c and before step d.

The liquid etchant is chosen so that it can isotropically etch the first layer selectively with respect to the second layer. For instance, if the first layer is a silicon oxide layer, the liquid etchant may comprise HF.

In embodiments, step c is performed until a part (210) of the bottom surface (21) of the second layer (2), around a periphery of the bottom (61) of the first nanopore (6), is exposed to the liquid etchant. This is the situation depicted in FIG. 3. This allows for the formation of a first plug (8) that is particularly effective at preventing contamination and damages to the nanopore (6).

In embodiments, the part (210) of the bottom surface (21) of the second layer (2) around a periphery of the bottom (61) may be shaped as a ring, i.e. as a circular band of bottom surface (21), wherein the width of the band ranges from 1 nm to 100 nm, generally ranging from 5 nm to 50 nm, or typically ranging from 10 to 15 nm.

In embodiments, the width (W) of the cavity (7) may range from 1% to 20%, generally ranging from 2% to 5%, larger than the width (w1) of the bottom (61) of the first nanopore (6) after step c and before step d.

In embodiments, the cavity (7) may have the shape of a truncated spheroid, e.g., a truncated sphere.

Typically, the bottom of the cavity (7) is comprised in the first layer.

We now refer to FIG. 4 where the result of step d is depicted in an embodiment of the present disclosure. In step d, the first nanopore (6) and the entire cavity (7) is filled with a solid filling material, thereby forming a first plug (8). The presence of the first plug (8) will protect the first nanopore (6) during step e, and in some embodiments, during step e'. Typically, the solid filling material is provided in the first nanopore (6) and in the entire cavity (7) by a conformal deposition process, such as chemical vapor deposition, e.g., high aspect ratio chemical vapor deposition.

If further layers are present over the second layer (2), and if the first nanopore (6) extends in these further layers, step d may comprise filling the part of the nanopore (6) extending in these further layers.

The first plug (8) is typically in a different material than the first layer (1) and the second layer (2). If further layers are present over the second layer (2), the first plug (8) is typically in a different material than the further layers.

Typically, the first plug (8) is in a material such that the second layer (2), and eventual further layers above the second layer (2), can be removed selectively with respect to the first plug (8).

Typically, the first plug (8) is in a material such that silicon oxide, and in some embodiments also aluminium oxide, can be etched selectively with respect to the first plug (8).

Typically, the plug (8) is in a material that can be etched selectively with respect to the second layer. For example, the plug (8) may comprise amorphous silicon. This is beneficial, for instance, when the first layer is $SiO_2$ and the second layer is $Si_3N_4$ We now refer to FIGS. 5 and 6 where intermediates obtained during step e according to embodiments of the present disclosure are depicted.

In step e, a bottom fluidic access (91) for the nanopore is formed by removing part of the first substrate (5) (see FIG. 5) and part of the first layer (1) (see FIG. 6) so as to expose the plug (8).

In embodiments, this removal may be performed by etching of the first substrate (5), followed by etching of the first layer (1) in conditions such that the first layer (1) is removed selectively with respect to the plug (8). For example, the first substrate (5), when comprising Si, may be etched by a silicon dry plasma etching process comprising $SF_6$. In this example, when the first layer (1) is an oxide, the silicon etching process may stop at the first layer (1), which then functions as an etch stop layer. Subsequently, the first layer (1) may be etched by a wet etch comprising HF. In this example, when the plug (8) comprises amorphous silicon, the plug (8) may remain unaffected by the wet etch comprising HF.

Figure 5:
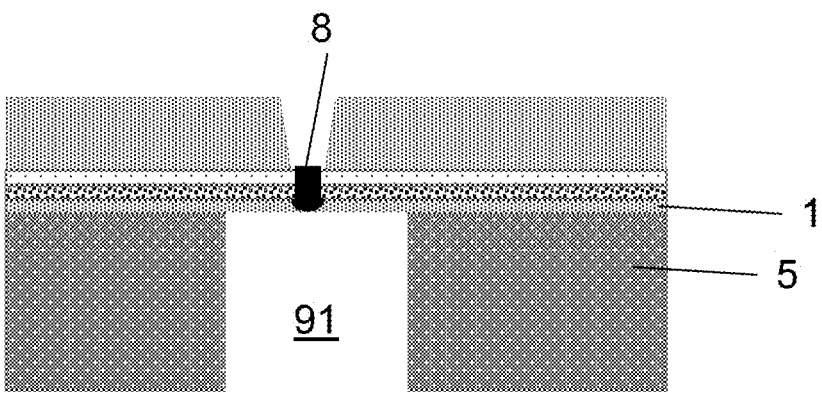
Figure 6:
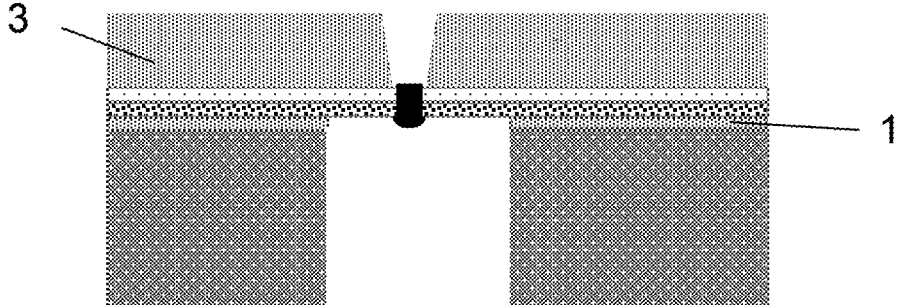

In the embodiments depicted in FIGS. 5 and 6, the bottom fluidic access is formed before the optional formation of a top fluidic access.

Figure 7:
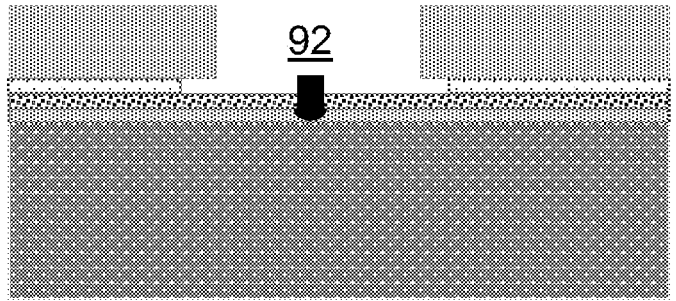
FIGS. 7 to 10 show cross-sections through schematic representations of intermediate structures obtained after various steps of another embodiment of the present disclosure.
Figure 8:
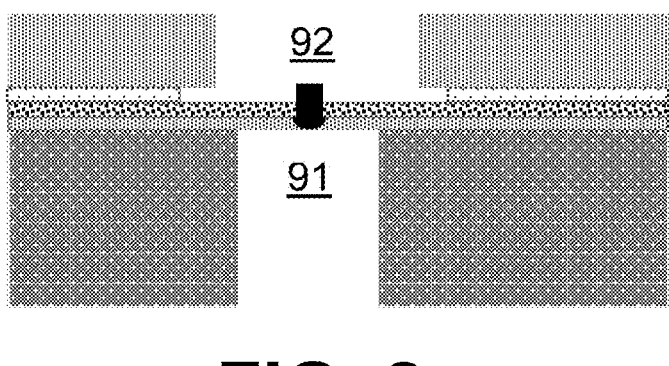
Figure 9:
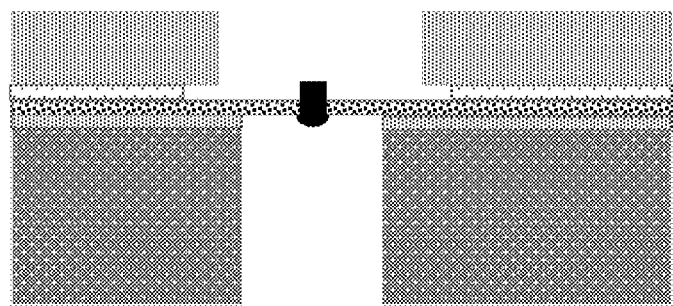

We now refer to FIGS. 7 to 9 where a top fluidic access (92) is formed in the third and fourth layer before that the bottom fluidic access (91) is formed.

In embodiments, the bottom fluidic access (91), and if present, the top fluidic access (92), each comprises a channel having a width of less than 100 μm.

Typically, the bottom fluidic access may comprise a channel having a width larger than the width of the first nanopore, and if present, the top fluidic access may comprise a channel having a width larger than the width of the width of the second nanopore.

In embodiments, the bottom fluidic access (91), and if present, the top fluidic access (92), each comprises a channel having a width of at least 1 μm, generally at least 10 μm, or typically at least 40 μm.

Figure 10:
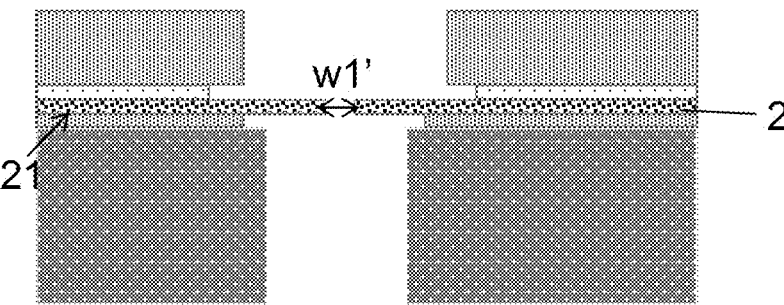

We now refer to FIG. 10 depicting a structure after that step f has been performed in the embodiment of FIG. 9. In any embodiment of the first aspect, step f comprises removing the first plug (8), thereby fluidly connecting the bottom fluidic access (91) to the first nanopore (6). In the embodiment of FIG. 10, the removal of the first plug (8) results in the fluidic connection of both the bottom fluidic access (91) and the top fluidic access with the first nanopore (6).

The removal of the first plug is usually performed by wet etching. The liquid etchant used in the wet etching is generally selective to the material forming the plug.

In embodiments, the width (w1') of the first nanopore (6) after step f is within 1 nm of the width (w1) of the first nanopore (6) between step c and step d, when measured in the plane of the bottom surface (21) of the second layer (2).

Figure 11:
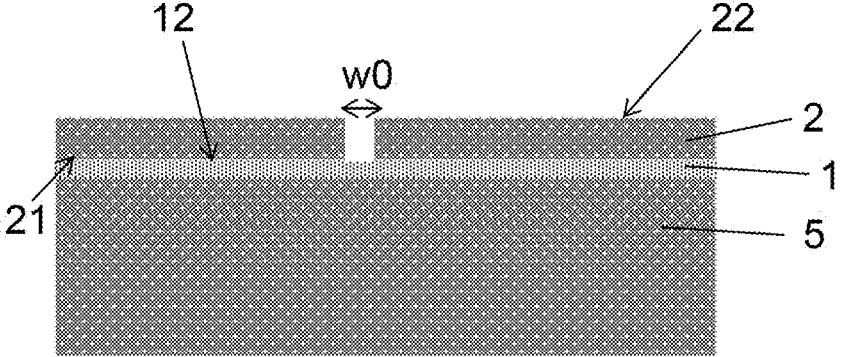

We now refer to FIGS. 11, and 12 wherein a structure resulting from step b performed in an embodiment of the present disclosure is depicted. FIG. 12 is similar to FIG. 2, parts a and b, but differs by the nature and number of the layers used. In FIG. 12, the first layer is a silicon oxide layer and the second layer is a monocrystalline silicon layer. In FIG. 11, a precursor nanopore can be formed in the second layer in such a way that part of the first layer (1) coincides with a bottom of the precursor nanopore. The precursor nanopore is formed via a dry etching step b1. The precursor nanopore has a width (w0). We now refer to FIG. 12 which depicts the result of a step b2, performed between step b1 and step c, of narrowing the width (w0) of the precursor nanopore (6) by oxidizing inner walls (63) thereof.

In embodiments, when a step b2 is performed and the second layer (2) is a semiconductor layer, such as a silicon layer, a layer of oxide may form on the second layer (2).

Figure 13:
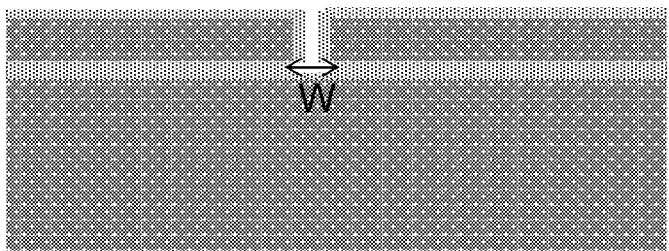

In FIG. 13, a structure resulting from step c is depicted in an embodiment of the present disclosure.

In FIG. 14, a structure resulting from step d is depicted in an embodiment of the present disclosure.

In embodiments, the first plug (8) may cover part of the top surface of the second layer (2) or of the top layer amongst eventual further layers present on the second layer (2). In the case for FIG. 14, the first plug (8) covers part of the top surface of an oxide layer present on the second layer (2).

In other words, in embodiments, a top section of the first plug (8) may have a larger width than the width of the first nanopore. This can be beneficial because it provides a particularly good protection of the top part of the nanopore during the formation of the top fluidic access.

Figures 17, 18:
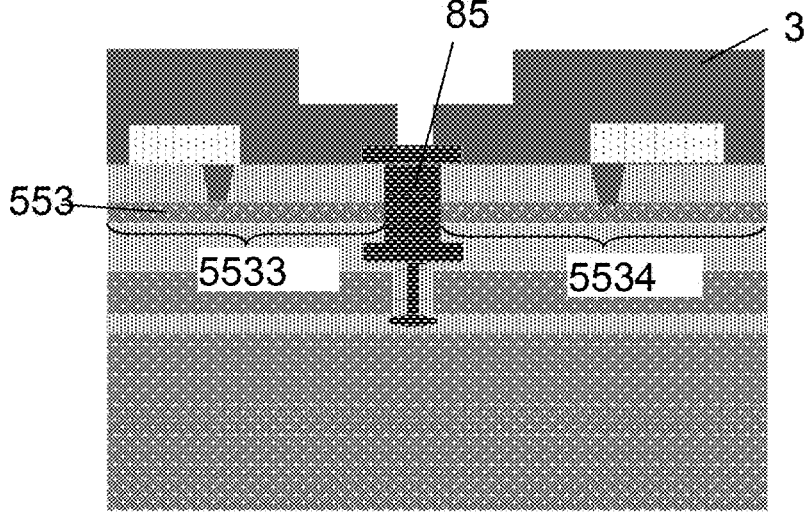

We now refer to FIGS. 15 to 17 wherein intermediate structures produced during a step d' are depicted.

These figures illustrate embodiments wherein the method further comprises a step d' between step d and step e of:

i. Covering the first plug (8) with an oxide layer (95),
ii. Planarizing the oxide layer (95), and
iii. Bonding a second substrate (55) on the planarized oxide layer (95), the second substrate (55) comprising a semiconductor layer (553).

An example of a structure obtainable at this stage is depicted in FIG. 15. In FIG. 15, the second substrate comprises a semiconductor layer (553) and an oxide layer thereover. This structure results from the bonding of a silicon-on-insulator substrate on the planarized oxide layer resulting from step d'.ii., followed by the removal of the top silicon layer of the silicon-on-insulator substrate.

In FIGS. 16 to 18, as in FIGS. 7 to 8, embodiments are depicted wherein step e' is performed before step e. In FIG. 5, an embodiment is depicted wherein step e is performed before e'.

FIG. 16 shows the result of step d'.iv. of an embodiment of the method where step d'.iv. comprises dry etching a second nanopore (65), aligned with the first nanopore (6), in the second substrate (55) and the oxide layer (95), until a part (80) of the first plug (8) coincides with a bottom (651) of the second nanopore (65), the second nanopore (65) having a width (w2) measured in the plane of the top surface (5532) of the semiconductor layer (553), ranging from 5 to 15 times the width (w1') of the first nanopore (6) after step f. In embodiments, the second nanopore may be a fluidic channel.

The second nanopore may be aligned with the first nanopore. In other words, a vertical central axis of the first nanopore may be comprised in the second nanopore and typically coincides with a vertical central axis of the second nanopore.

We now refer to FIG. 17 wherein a structure resulting from steps d'.v to d'.viii is depicted in an exemplary embodiment of the present disclosure.

This structure is obtained from a structure resulting from step d'.iv by:

v. filling the second nanopore (65) with a solid filling material, thereby forming a second plug (85),
vi. doping the semiconductor layer (553) on opposite sides of the second nanopore (65), thereby forming a source region (5533) and a drain region (5534),
vii. activating the source region (5533) and the drain region (5534) by annealing, and
viii. forming metal contacts (5535) to the source (5533) and at the drain (5534) region.

The second plug (85) is typically in a different material than the second layer (2). If further layers are present over the second layer (2), the second plug (85) is typically in a different material than the further layers.

Typically, the second plug (85) is in a material such that it can be removed selectively with respect to the second layer (2), and eventual further layers above the second layer (2).

Typically, the second plug (85) is in a material that can be etched selectively with respect to silicon oxide, aluminum oxide, and silicon.

Typically, the second plug (85) is in a material such that the second layer and the eventual further layers can be etched selectively with respect to the first plug (8). Typically, the second plug (85) is in a material that is different from the material of the second layer and the eventual further layers.

In embodiments, the solid filing material used for forming the second plug (85) may the same as the solid material used for forming the first plug (8). In embodiments, the formation of the second plug (85) may be performed with a conformal method. In embodiments, the method used for forming the second plug (26) may be the same as the method used for forming the first plug.

In FIG. 18, a structure resulting from step e is depicted.

In FIG. 19, a structure resulting from step f is depicted.

In embodiments where the second nanopore (65) and the second plug (85) are not present (e.g., in the case of FIG. 6), the method may further comprise a step e', between step d and step f, of forming a top fluidic access (92) for the first nanopore (6) by providing a third layer (3) over the second layer (2) and the first plug (8) if such a third layer (3) is not already present, and removing part of the third layer (3) so as to expose the first plug (8).

In embodiments where the second nanopore (65) and the second plug (85) are present, the method may further comprise a step e' of forming a top fluidic access (92) for the second nanopore (65) by providing a third layer (3) over the second substrate and the second plug (85) if such a third layer (3) is not already present, and removing part of the third layer (3) so as to expose the second plug (85). This is illustrated in FIG. 17.

In embodiments, step d' may be performed before step e'. This is the situation depicted in FIGS. 15 to 17.

In embodiments, the method may further comprise a step of removing the second plug (85), thereby fluidly connecting the top fluidic access (92) to the second nanopore (65). In embodiments, the second plug (85) may be removed at the same time as the first plug (8), i.e., during step f. This embodiment is illustrated in FIG. 19. As an example, the first plug (8) and the second plug (85) may be removed by a wet etch comprising tetramethylammonium hydroxide (TMAH). The resulting structure is a nanopore transistor comprising a fluidic resistor. In this embodiment, the second nanopore acts as a fluidic resistor for the first nanopore. In short, as an example (and with reference to FRAIKIN, Jean-Luc, et al. "A high-throughput label-free nanoparticle analyser", Nature nanotechnology, 2011, Vol. 6.5: 308-313), a voltage sensor may be present in a fluidic channel (93) connecting the first nanopore (6) and the second nanopore (65). A fluid may be present in the microfluidic device. The sensor is typically capacitively (through a double-layer present on the sensor) electrically coupled to the fluid in the fluidic channel (93). The fluidic channel (93) may have a width that is larger than a width of the first nanopore (6) and larger than a width of the second nanopore (65). A first electrode may be exposed to the fluid in the top fluidic access (92) and a second electrode may be exposed to the fluid in the bottom fluidic access (91). A constant voltage may be applied to the first electrode. A first voltage drop exists over the first nanopore (6), i.e., between the first electrode and the sensor, and a second voltage drop exists over the second nanopore (65), i.e., between the sensor and the second electrode. As such, the first nanopore (6), and the fluidic resistor, i.e., the second nanopore (65), act as a fluidic potential divider. When an analyte, e.g., a biomolecule comprising a nucleic or amino acid sequence, moves through the first nanopore (6), the sensor may detect a voltage change of the first voltage. Said voltage change may be proportional to a voltage difference between the first and second electrode, and to a volume fraction of the first nanopore (6) filled with the analyte, and may increase with a resistance over the fluidic resistor (FRAIKIN, Jean-Luc, et al. A high-through-put label-free nanoparticle analyser. Nature nanotechnology, 2011, Vol. 6.5: 308-313). The second nanopore (65) is typically wider than the first nanopore (6) so that the resistance over the second nanopore (65) may be constant. At the same time, the second nanopore (65) is typically not very wide. A benefit of the voltage divider can be that a high signal-to-noise ratio may be achieved.

In a second aspect, the present disclosure relates to an intermediate in the construction of a microfluidic device (see FIGS. 3 and 13) comprising:

a. A first substrate (5), b. A first layer (1) on the first substrate (5), the first layer (1) having a top surface (12), c. A second layer (2) on the first layer (1), wherein the second layer (2) has a bottom surface (21) in contact with the first layer (1) and a top surface (22) facing away from the first layer (1), d. A first nanopore (6) through the second layer (2), having a bottom (61) in the plane of the top surface (12) of the first layer (1), and e. A cavity (7) under the first nanopore (6), fluidly connected therewith, and having a larger width (W) than a width (w1) of the nanopore (6).

In embodiments, the cavity (7) exposes a part (210) of the bottom surface (21) of the second layer (2) around a periphery of the bottom (61) of the nanopore (6).

In embodiments, the cavity does not extend in the first substrate and has a closed bottom in the first layer (see FIGS. 3 and 13).

Any feature of the second aspect may be as correspondingly described for any embodiment of the first aspect.

It will be understood that although embodiments, specific constructions, and configurations, as well as materials, have been discussed herein for devices according to the present disclosure, various changes or modifications in form and detail may be made without departing from the scope of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for manufacturing a microfluidic device, the method comprising:

a) providing a first substrate having a first layer thereon, and a second layer on the first layer, wherein the second layer has a bottom surface in contact with a top surface of the first layer, and a top surface facing away from the first layer;

b) forming a first nanopore in the second layer in such a way that a part of the first layer coincides with a bottom of the first nanopore, wherein forming the first nanopore comprises a dry etching step;

c) exposing said part of the first layer to a liquid etchant, thereby forming a cavity under the first nanopore, the cavity having a larger width (W) than a width (w1) of the bottom of the first nanopore after step c and before step d;

d) filling the first nanopore and the entire cavity with a solid filling material, thereby forming a first plug;

e) forming a bottom fluidic access for the first nanopore by removing a part of the first substrate and the part of the first layer so as to expose the first plug, and forming a top fluidic access for the first nanopore by providing a third layer over the second layer and the first plug if such a third layer is not already present, and removing part of the third layer so as to expose the first plug; and f) removing the first plug, thereby fluidly connecting the bottom fluidic access to the first nanopore.

2. The method according to claim 1, wherein the width (w1') of the first nanopore after step f is within 1 nm of the width (w1) of the first nanopore between step c and step d, when measured in the plane of the bottom surface of the second layer.

3. The method according to claim 1, wherein the first plug comprises amorphous silicon.

4. The method according to claim 1, wherein the first nanopore has a width (w0) after step b and before step c ranging from 3 to 50 nm, ranging from 5 to 45 nm, or ranging from 8 to 30 nm, when measured in a plane of the bottom surface of the second layer.

5. The method according to claim 1, wherein the first nanopore has a length through the second layer after step b and before step c ranging from 400 nm to 2 μm.

6. The method according to claim 1, wherein step b comprises a step b1 of dry etching a precursor nanopore in the second layer, the precursor nanopore having a width (w0), followed by a step b2 between step b1 and step c of narrowing the width (w0) of the precursor nanopore by oxidizing inner walls of the precursor nanopore.

7. The method according to claim 6, wherein the width (w0) of the first nanopore before step b2 ranges from 100 to 300 nm, and wherein a width (w0') of the first nanopore after step b2 and before step c ranges from 8 to 30 nm.

8. The method according to claim 1, further comprising a step d' between step d and step e of:
   i) covering the first plug with an oxide layer;
   ii) planarizing the oxide layer;
   iii) bonding a second substrate on the planarized oxide layer, the second substrate comprising a semiconductor layer;
   iv) dry etching a second nanopore, aligned with the first nanopore, in the second substrate and the oxide layer, until a part of the first plug coincides with a bottom of the second nanopore, the second nanopore having a width (w2) measured in the plane of the top surface of the semiconductor layer, ranging from 5 to 15 times the width (w1') of the first nanopore after step f;
   v) filling the second nanopore with a solid filling material, thereby forming a second plug;
   vi) doping the semiconductor layer on opposite sides of the second nanopore, thereby forming a source region and a drain region;
   vii) activating the source region and the drain region by annealing; and
   viii) forming metal contacts to the source region and at the drain region.

9. The method according to claim 8, further comprising a step of removing the second plug, thereby fluidly connecting the top fluidic access to the second nanopore.

10. The method according to claim 1, further comprising a step of removing the second plug, thereby fluidly connecting the top fluidic access to the second nanopore.

11. The method according to claim 1, wherein forming the top fluidic access for the first nanopore is performed before forming the bottom fluidic access for the first nanopore.

12. The method according to claim 1, wherein step c is performed until a part of the bottom surface of the second layer, around a periphery of the bottom of the first nanopore, is exposed to the liquid etchant.

* * * * *